United States Patent
Kurihara et al.

(10) Patent No.: US 12,399,001 B2
(45) Date of Patent: Aug. 26, 2025

(54) METHOD FOR MEASURING SURFACE PARAMETER OF COPPER FOIL, AND METHOD FOR SORTING COPPER FOIL

(71) Applicant: MITSUI MINING & SMELTING CO., LTD., Tokyo (JP)

(72) Inventors: Hiroaki Kurihara, Ageo (JP); Takeshi Iwase, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 18/714,993

(22) PCT Filed: Dec. 14, 2022

(86) PCT No.: PCT/JP2022/046102
§ 371 (c)(1),
(2) Date: May 30, 2024

(87) PCT Pub. No.: WO2023/120337
PCT Pub. Date: Jun. 29, 2023

(65) Prior Publication Data
US 2024/0418504 A1      Dec. 19, 2024

(30) Foreign Application Priority Data

Dec. 22, 2021   (WO) .................. PCT/JP2021/047646

(51) Int. Cl.
*G01B 11/30*      (2006.01)
*G01B 9/04*       (2006.01)
(Continued)

(52) U.S. Cl.
CPC ............... *G01B 11/30* (2013.01); *G01B 9/04* (2013.01); *G01N 21/95623* (2013.01); *G01N 2021/95638* (2013.01); *H05K 1/0237* (2013.01)

(58) Field of Classification Search
CPC ............ G01B 11/30; G01N 21/95623; G01N 2021/95638
See application file for complete search history.

(56) References Cited

U.S. PATENT DOCUMENTS

2010/0089758 A1   4/2010   Tomonaga et al.
2020/0095701 A1   3/2020   Sung et al.

FOREIGN PATENT DOCUMENTS

JP   H6-337214 A   12/1994
JP   H9-241882 A    9/1997
(Continued)

OTHER PUBLICATIONS

Obata, CN-107614760, English Translation (Year: 2018).*
(Continued)

*Primary Examiner* — Michael J Dalbo
(74) *Attorney, Agent, or Firm* — GREENBLUM & BERNSTEIN, P.L.C.

(57) ABSTRACT

A measurement method capable of acquiring, in a simple manner, a surface parameter of copper foil exhibiting high correlation with high frequency characteristics, the method including: (a) acquiring a surface profile of surface-treated copper foil as a reference; (b) setting a cutoff value for an L filter, the cutoff value satisfies: (i) an arithmetical mean height Sa after processing with the L filter, being 0.5 μm or less, and (ii) a percent change of Sdr or α value after processing with the L filter being 80% or less; (c) acquiring a surface profile of surface-treated copper foil as a measurement object; (d) subjecting the acquired surface profile of the copper foil as the measurement object to filter processing; and (e) calculating at least one of surface parameters defined in ISO25178 on the copper foil as the measurement object based on the surface profile after the filter processing.

11 Claims, 11 Drawing Sheets

(51) Int. Cl.
*G01N 21/956* (2006.01)
*H05K 1/02* (2006.01)

(56) References Cited

FOREIGN PATENT DOCUMENTS

| JP | 2013-221856 A | 10/2013 |
| JP | 2020-50954 A | 4/2020 |
| JP | 2021-26839 A | 2/2021 |
| WO | WO 2008/041706 A1 | 4/2008 |
| WO | WO 2017/006739 A1 | 1/2017 |

OTHER PUBLICATIONS

Tanaka, JP-2018163167, English Translation (Year: 2018).*
ISR for PCT/JP2022/046102, dated Feb. 7, 2023 (w/ translation).
"Guidelines for high-speed transmission line test methods of the flexible printed wiring board, first edition", Japan Electronics Packaging and Circuits Association, Jun. 5, 2019 (w/ partial translation).
Decision to Grant for JP App. No. 2023-562766, dated Nov. 8, 2023 (w/ translation).
Mitaka Kohki, "NH Series Point Autofocus Probe—3D Measuring Instrument", which may be found in Japanese at "https://www.mitakakohki.co.jp/industry/images/NH.pdf".

* cited by examiner

METHOD FOR MEASURING SURFACE PARAMETER OF COPPER FOIL, AND METHOD FOR SORTING COPPER FOIL

TECHNICAL FIELD

The present invention relates to a method for measuring a surface parameter of copper foil, and a method for selecting copper foil.

BACKGROUND ART

Copper foil is widely used in a step for producing a printed-wiring board in a form of a copper-clad laminated sheet in which copper foil is adhered to an insulating resin substrate. In this regard, the copper foil and the insulating resin substrate desirably have strong adhesive force in order to prevent wiring from being peeled during production of a printed-wiring board. Therefore, in usual copper foil for producing a printed-wiring board, adhesiveness is increased by subjecting a surface to be adhered to copper foil to a surface treatment such as a roughening treatment, to form irregularities formed from fine copper particles, and causing the irregularities to dig into the inside of the insulating resin substrate through pressing to exert anchor effect.

As portable electronic devices and the like are made more functional in recent years, frequencies of signals become increasingly high so as to process a profusion of information at high speed, and printed-wiring boards suitable for high frequency application are desired. Transmission loss is desirably reduced for such printed-wiring boards for high frequencies in order to make it possible to transmit a high frequency signal without deteriorating quality. A printed-wiring board includes copper foil processed to have a wiring pattern and an insulating substrate, and main losses in transmission loss include conductor loss resulting from the copper foil and dielectric loss resulting from the insulating substrate.

As copper foil used for a printed-wiring board for high frequencies, Patent Literature 1 (JP2020-50954A) discloses finely roughened electrodeposited copper foil having a finely roughened surface that includes a plurality of peaks, a plurality of recessed grooves, and a plurality of fine crystal clusters, and indicates that according to the copper foil, loss during signal transportation can be effectively suppressed, for example. Patent Literature 1 also indicates that the Rlr value of the copper foil is measured under conditions of $\lambda s=2.5$ μm and $\lambda c=0.003$ mm using a laser microscope.

High frequency characteristics (frequency dependency of transmittance loss) of a printed-wiring board is known to correlate with surface roughness of copper foil, and the lower the roughness of copper foil used, the better the high frequency characteristics, in general. As a method for measuring surface roughness of copper foil, Non-Patent Literature 1 (guidelines for high-speed transmission line test methods of the flexible printed wiring board, first edition) discloses a method for testing, in a three-dimensional manner, a surface profile of copper foil for a high-frequency transmission line, for example. Non-Patent Literature 1 indicates that, in this test method, an arithmetical mean height Sa is obtained by processing with a predetermined S filter (0.5 μm or 0.8 μm) and an L filter (25 μm, 50 μm, or 80 μm) using a measurement device (e.g., a confocal chromatic probe, a phase-shifting interferometric microscope, a coherence scanning interferometer, a point autofocus probe, a focus variation microscope, a confocal microscope, etc.) in accordance with ISO25178.

CITATION LIST

Patent Literature

Patent Literature 1: JP2020-50954A
Patent Literature 2: JPH9-241882A
Patent Literature 3: WO2008/041706A1

Non-Patent Literature

Non-Patent Literature 1: Guidelines for high-speed transmission line test methods of the flexible printed wiring board, first edition, Japan Electronics Packaging and Circuits Association, issued on Jun. 5, 2019

SUMMARY OF INVENTION

However, surface parameters calculated by a conventional method for measuring surface roughness of copper foil have not always had sufficient correlation with high frequency characteristics. Therefore, it is required to produce surface-treated copper foil and to actually evaluate high frequency characteristics, while excessive working hours and materials had been required.

The present inventors have now found that when a cutoff value for an L filter is set on the basis of a surface profile of surface-treated copper foil as a reference so as to satisfy a predetermined condition, and a surface profile of surface-treated copper foil as a measurement object is subsequently processed with an L filter with the cutoff value preliminarily set, a surface parameter exhibiting high correlation with high frequency characteristics can be acquired in a simple manner.

Accordingly, an object of the present invention is to provide a measurement method capable of obtaining, in a simple manner, a surface parameter of copper foil exhibiting high correlation with high frequency characteristics.

The present invention provides the following aspects:

[Aspect 1]
A method for measuring a surface parameter of copper foil, comprising the steps of:
(a) acquiring a surface profile on a treated surface of a surface-treated copper foil as a reference for setting a filter condition;
(b) setting a cutoff value for an L filter based on the surface profile, wherein the cutoff value satisfies:
 (i) Sa1, which is an arithmetical mean height Sa after processing with the L filter, being 0.5 μm or less, and
 (ii) a percent change of developed interfacial area ratio Sdr before and after processing with the L filter being 80% or less, the percent change of Sdr being represented by a formula $(|Sdr0-Sdr1|/Sdr0) \times 100$, wherein Sdr0 is an Sdr before processing with the L filter, and Sdr1 is an Sdr after processing with the L filter, or
 (ii') a percent change of a value before and after processing with the L filter being set to be 80% or less, the percent change of α value being represented by a formula $(|\alpha 0 - \alpha 1|/\alpha 0) \times 100$, wherein α0 is an α value before processing with the L filter, and α1 is an α value after processing with the L filter; the α value being obtained by dividing a core material volume Vmc by a core height Sk to obtain a quotient and multiplying the quotient by a developed interfacial area ratio Sdr, that is, obtained by a formula (Vmc/Sk)×Sdr; and the Sa, the Sdr, the Vmc and the Sk being surface parameters defined by ISO25178;

(c) acquiring a surface profile on a treated surface of a surface-treated copper foil as a measurement object, the surface-treated copper foil as the measurement object being produced or treated under the same condition as the surface-treated copper foil as the reference;

(d) subjecting the acquired surface profile of the surface-treated copper foil as the measurement object to filter processing, the filter processing including processing using an L filter with the cutoff value; and (e) calculating at least one of surface parameters defined in ISO25178 on the treated surface of the surface-treated copper foil as the measurement object based on the surface profile after the filter processing.

[Aspect 2]

The method for measuring a surface parameter of copper foil according to Aspect 1, wherein, in the step (d), the filter processing is conducted without using an S filter.

[Aspect 3]

The method for measuring a surface parameter of copper foil according to Aspect 1 or 2, wherein the Sa1 is 0.3 μm or less, and the percent change of Sdr is 70% or less.

[Aspect 4]

The method for measuring a surface parameter of copper foil according to any one of Aspects 1 to 3, wherein the Sa1 is 0.3 μm or less, and the percent change of a value is 70% or less.

[Aspect 5]

The method for measuring a surface parameter of copper foil according to any one of Aspects 1 to 4, wherein, in the step (b), a second order differential of a surface parameter defined in ISO25178 is calculated to set the cutoff value for the L filter.

[Aspect 6]

A method for selecting copper foil, comprising the steps of:

measuring a surface parameter of copper foil using the method according to any one of Aspects 1 to 5, wherein the surface parameter is at least one selected from the group consisting of an arithmetical mean height Sa, a root mean square height Sq, a maximum height Sz, a developed interfacial area ratio Sdr, a core material volume Vmc, and a core height Sk defined by ISO25178; and selecting, as a copper foil suitable for a printed-wiring board for high frequency application, a copper foil having a surface in which the Sa is 1.2 μm or less, the Sq is 2.5 μm or less, the Sz is 14 μm or less, the Sdr is 60% or less, the Vmc is 1.5 μm³ or less, and/or the Sk is 4 μm or less.

[Aspect 7]

A method for producing a printed-wiring board for high frequency application, comprising the step of producing a printed-wiring board for high frequency application using a copper foil obtained by the method according to Aspect 6.

DESCRIPTION OF EMBODIMENTS

Definition

Definitions of terms and parameters used to specify the present invention are shown below.

An "arithmetical mean height Sa" or "Sa" herein is a parameter defined in ISO25178 and representing an average of absolute values of the difference in height at each point to the mean of a surface. That is, the Sa corresponds to a parameter obtained by expanding the arithmetical mean height Ra of a contour curve to a surface.

A "root mean square height Sq" or "Sq" herein is a parameter defined in ISO25178 and corresponding to a standard deviation of distances from the mean of a surface and corresponds to a standard deviation of heights.

A "maximum height Sz" or "Sz" herein represents a distance from the highest point to the lowest point of a surface defined in ISO25178.

A "developed interfacial area ratio Sdr" or "Sdr" herein is a parameter defined in ISO25178 and representing how much a developed area (surface area) of a defined region increases from the area of the defined region. Here, the developed interfacial area ratio Sdr herein is represented as an increase (%) in the surface area. The smaller this value is, the closer the surface shape is to flat, and the Sdr of a completely flat surface becomes 0%. On the other hand, the larger this value is, the more irregularities the surface shape has. For example, when the Sdr of a surface is 40%, the surface area of this surface increases by 40% from a completely flat surface.

Figure 1:
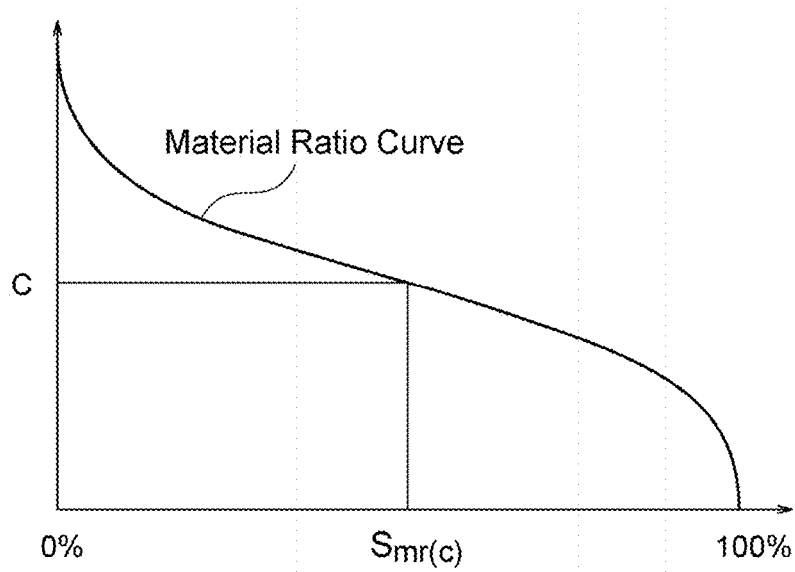
FIG. 1 is a diagram explaining a material ratio curve and an areal material ratio determined in accordance with ISO25178.
Figure 2:
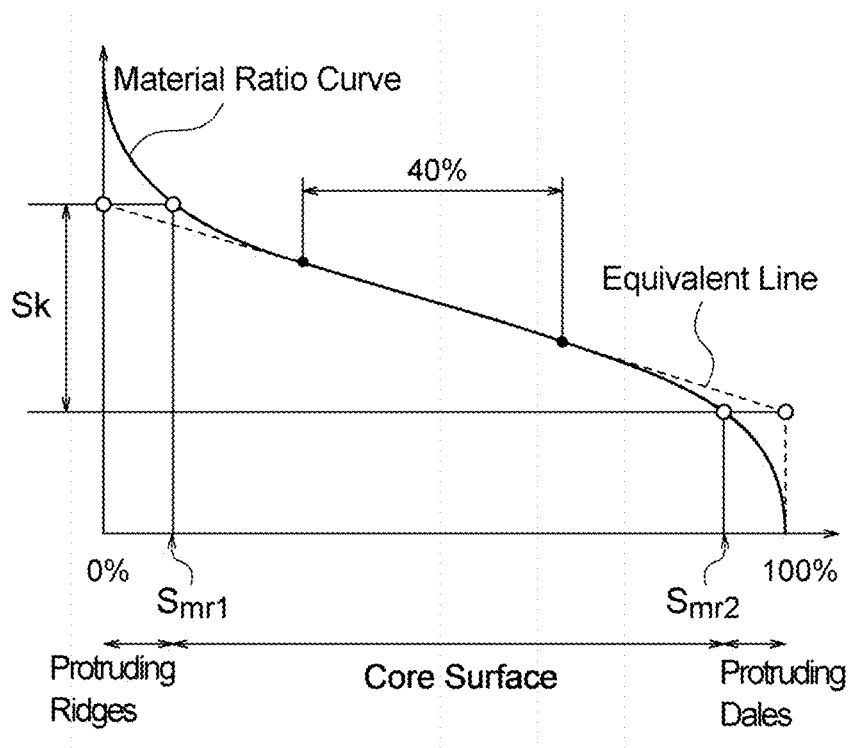
FIG. 2 is a diagram explaining an areal material ratio Smr1 segmenting protruding ridges and a core surface, an areal material ratio Smr2 segmenting protruding dales and the core surface, and a core height Sk of the core surface determined in accordance with ISO25178.

An "areal material ratio curve" (hereinafter, simply referred to as the "material ratio curve") herein is a curve defined in ISO25178 and representing a height at which the areal material ratio becomes 100% from 0%. The areal material ratio is a parameter representing an area of a region above a certain height c, as shown in FIG. 1. The areal material ratio at the height c corresponds to the Smr (c) in FIG. 1. As shown in FIG. 2, when a secant line of the material ratio curve extending from the areal material ratio of 0% along the material ratio curve with the difference in the areal material ratio of 40% is shifted from the areal material ratio of 0%, the position at which the secant line has the smallest gradient is referred to as a center portion of the material ratio curve. A straight line on which the sum of squares of deviations in the vertical axis direction becomes the smallest with respect to this center portion is referred to as an equivalent line. A portion included in the range of height in which the areal material ratio is 0% to 100% on the equivalent line is referred to as a core surface. The portion higher than the core surface is referred to as protruding ridges, and the portion lower than the core surface is referred to as protruding dales.

A "core height Sk" or "Sk" herein is a value defined in ISO25178 and obtained by subtracting a minimum height from a maximum height of the core surface, and is a parameter calculated from the difference in height between the areal material ratio of 0% and the areal material ratio of 100% on the equivalent line, as shown in FIG. 2.

Figure 3:
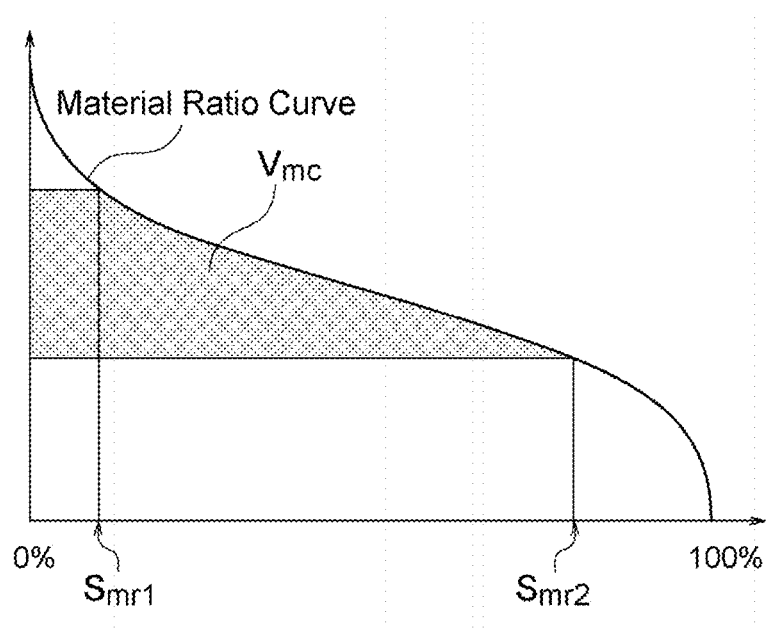
FIG. 3 is a diagram explaining a core material volume Vmc of the core surface determined in accordance with ISO25178.

A "core material volume Vmc" or "Vmc" herein is a parameter measured in accordance with ISO25178 and representing the volume of the core surface, as shown in FIG. 3. The Vmc herein is calculated with an areal material ratio Smr1 segmenting the core surface and the protruding ridges set to 10%, and an areal material ratio Smr2 segmenting the core surface and the protruding dales set to 80%.

Figure 4:
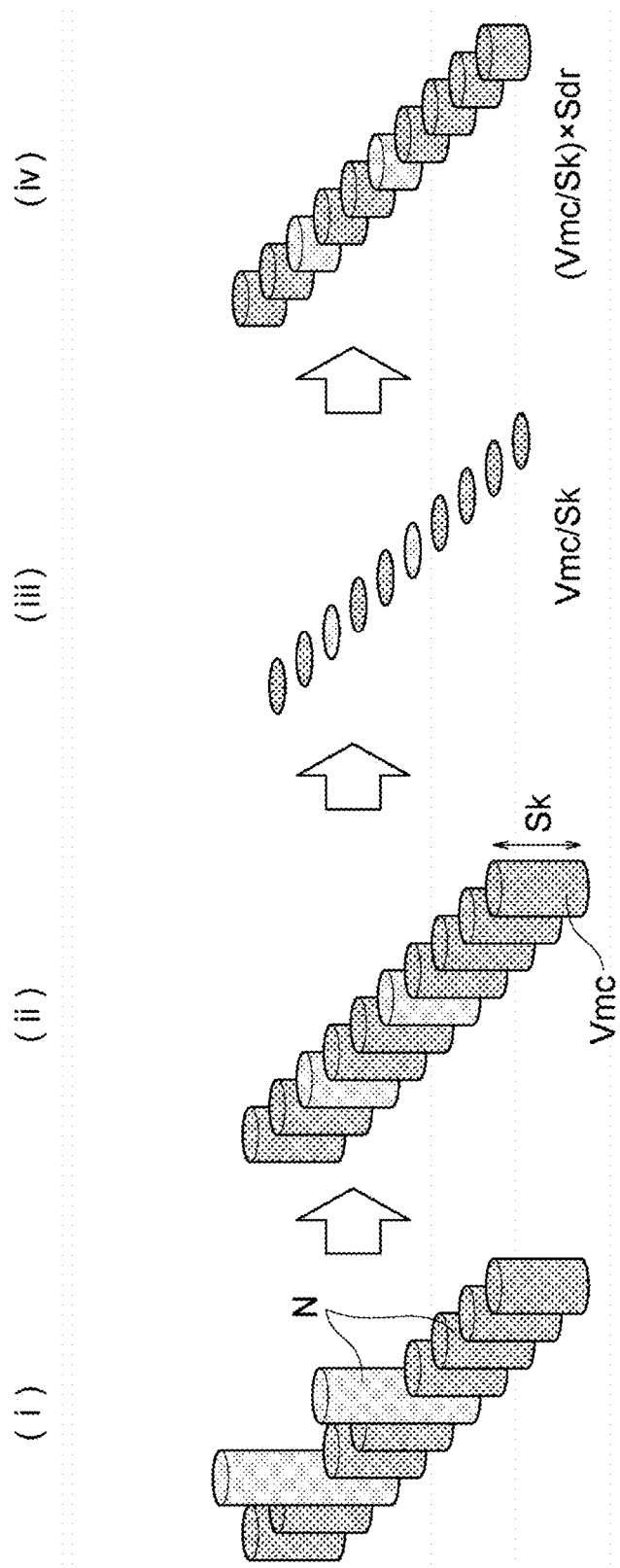
FIG. 4 is a schematic diagram of a copper foil surface having a plurality of nodules, the diagram explaining an α value.

An "α value" herein means a parameter obtained by dividing the core material volume Vmc by the core height Sk to obtain a quotient and multiplying the quotient by the developed interfacial area ratio Sdr, that is, obtained by the formula (Vmc/Sk)×Sdr. FIG. 4 illustrates a schematic diagram of a copper foil surface for explaining the α value. In the copper foil surface having a plurality of nodules N as shown in (i) of FIG. 4, the Vmc corresponds to the volume of the core surface in which protrusions are removed from the nodules N, and the Sk corresponds to the height of the core surface (see (ii) of FIG. 4). Accordingly, the value Vmc/Sk obtained by dividing the Vmc by the Sk corresponds to the area of the core surface (see (iii) of FIG. 4), and the α value obtained by multiplying the quotient of Vmc/Sk by the Sdr is considered to be a parameter reflecting the Sdr of the core surface (see (iv) of FIG. 4).

"Untreated copper foil" herein refers to copper foil in a state of not being subjected to a surface treatment such as a roughening treatment or a rust proofing treatment. The copper foil herein may be copper foil (so-called carrier-attached copper foil) including a support layer, a release layer, and a superthin copper layer.

An "electrode surface" of electrodeposited copper foil herein refers to a surface having been in contact with a cathode during production.

A "deposition surface" of electrodeposited copper foil herein refers to a surface on which electrodeposited copper is deposited during production, that is, a surface not in contact with a cathode.

An "L filter" herein is a filter for removing a long wavelength component and is also referred to as "Ac" in measurement (line roughness measurement) in a contour curve method. That is, the L filter is a filter for removing a large-scale wavelength component such as waviness of copper foil.

An "S filter" herein is a filter for removing a short wavelength component and is also referred to as "As" in measurement (line roughness measurement) in a contour curve method. That is, the S filter is a filter for removing a small-scale wavelength component such as a roughening treatment of copper foil.

Method for Measuring Surface Parameter of Copper Foil

The method of the present invention is a method for measuring a surface parameter of copper foil. This method includes the steps of (1) acquisition of a surface profile of reference copper foil, (2) setting of a cutoff value for an L filter, (3) acquisition of a surface profile of copper foil as a measurement object, (4) filter processing of the surface profile of the copper foil as the measurement object, and (5) calculation of a surface parameter of the copper foil as the measurement object. Hereinafter, each of steps (1) to (5) will be described with reference to drawings.

(1) Acquisition of Surface Profile of Reference Copper Foil

Figure 5:
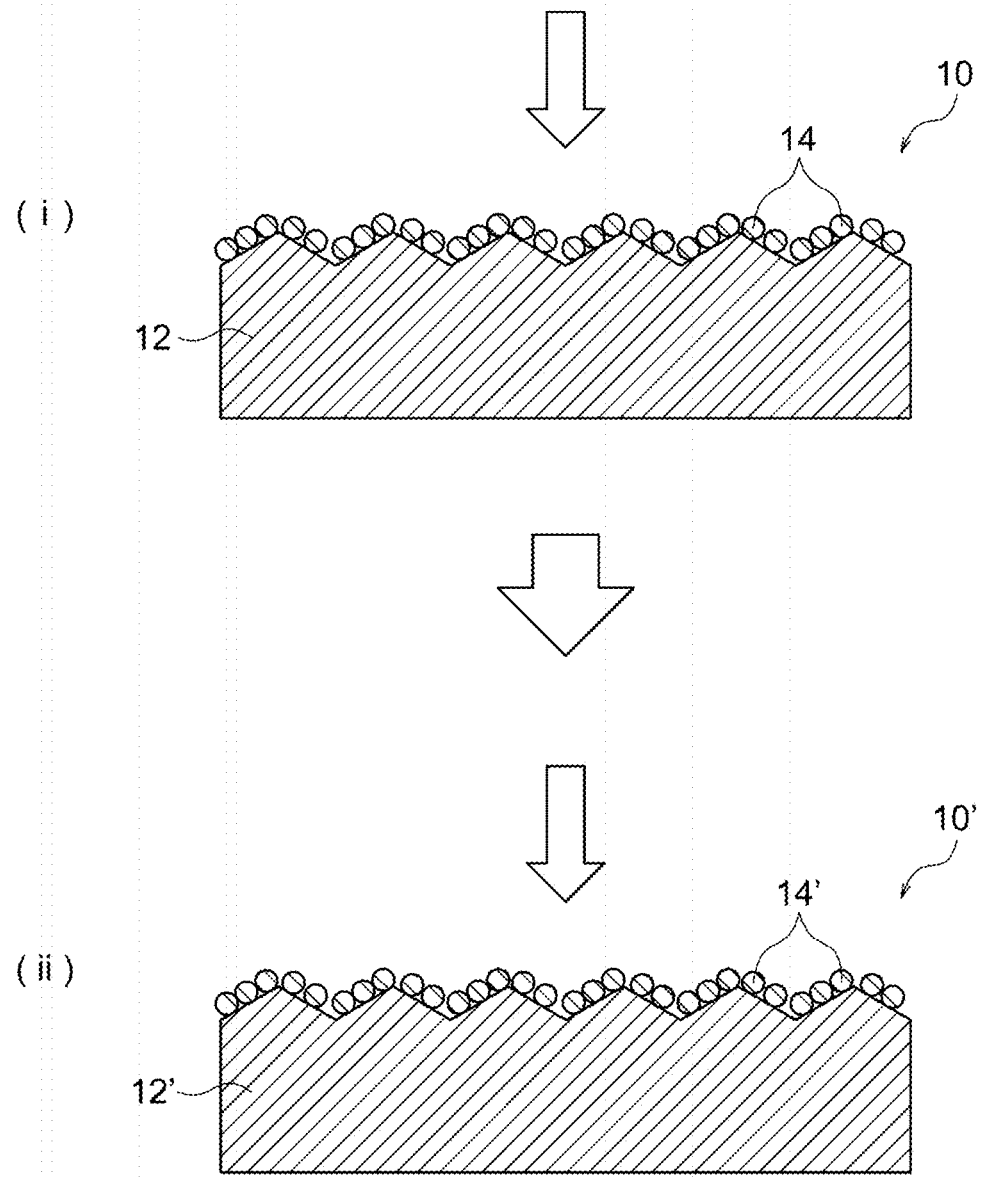
FIG. 5 is a step flowchart for explaining a method for measuring a surface parameter of copper foil according to the present invention.

FIG. 5 illustrates an example of the method for measuring a surface parameter of copper foil according to the present invention. As illustrated in (i) of FIG. 5, a surface profile of a treated surface of surface-treated copper foil 10 is acquired as a reference for filter condition setting. The surface-treated copper foil as the reference is sometimes referred to as "reference copper foil" herein.

The surface profile of the reference copper foil 10 for filter condition setting can be preferably acquired by measuring the treated surface of the reference copper foil 10 using a non-contact type surface roughness measurement instrument, for example, a commercially available laser microscope. When measurement is carried out by a laser microscope, the measurement area is preferably 90 μm² or more and 103,000 μm² or less, more preferably 1,000 μm² or more and 26,000 μm² or less, and still more preferably 1,000 μm² or more and 17,000 μm² or less. In addition, the measurement magnification of the laser microscope is preferably 50 times or more and 500 times or less and more preferably 100 times or more and 400 times or less.

The reference copper foil 10 may be produced according to a known method and known conditions or may be a commercially available product. For example, as illustrated in (i) of FIG. 5, the reference copper foil 10 can be successfully produced by subjecting at least one surface of untreated copper foil 12 to a surface treatment to form nodules 14 (for example, roughening particles) and the like. The thickness (referring to the thickness of a superthin copper layer in the case of carrier-attached copper foil) of the reference copper foil 10 is preferably 0.5 µm or more and 210 µm or less and more preferably 0.5 µm or more and 70 µm or less.

The untreated copper foil 12 may be any of electrodeposited copper foil and rolled copper foil and is preferably electrodeposited copper foil. Examples of a surface treatment for the untreated copper foil 12 include a roughening treatment, a rust proofing treatment, a coupling agent treatment, and any combination thereof. For example, the reference copper foil 10 preferably includes nodules 14 by subjecting the untreated copper foil 12 to at least a roughening treatment, but may be copper foil obtained by subjecting the untreated copper foil 12 only to a rust proofing treatment without a roughening treatment. When the untreated copper foil 12 is electrodeposited copper foil, any of an electrode surface and a deposition surface of the electrodeposited copper foil may be subjected to the surface treatment.

(2) Setting of Cutoff Value for L Filter

A cutoff value for the L filter is set on the basis of the acquired surface profile of the surface-treated copper foil 10 as the reference. Steps of setting a measurement condition for surface-treated copper foil as a measurement object one by one and calculating a surface parameter are made unnecessary by preliminarily setting the cutoff value for the L filter in such a manner. In addition, irregularities on a treated surface of surface-treated copper foil include a roughness component associated with nodules (roughening particles and the like) and a waviness component associated with waviness of copper foil. Then, transmission loss in a printed-wiring board is increased by the skin effect of copper foil which is prominently exhibited as the frequency becomes higher, but the waviness component hardly affects transmission loss, and the roughness component mainly affects transmission loss. In this regard, a surface parameter exhibiting high correlation with high frequency characteristics can be acquired in a simple manner by setting the cutoff value for the L filter so as to satisfy the conditions described later. Here, the cutoff value for the L filter may be set so as to satisfy either the first aspect or the second aspect described later or may be set so as to satisfy both the first aspect and the second aspect.

According to a first aspect of the present invention, the cutoff value for the L filter is set so as to satisfy the following items: (i) Sa1, which is the Sa after processing with the L filter, is 0.5 µm or less; and (ii) the percent change of Sdr before and after processing with the L filter represented by the formula (|Sdr0−Sdr1|/Sdr0)×100 (in the formula, Sdr0 is the Sdr before processing with the L filter, and Sdr1 is the Sdr after processing with the L filter) is 80% or less. The cutoff value for the L filter is preferably set such that Sa1 is 0.3 µm or less and the percent change of Sdr is 70% or less, is more preferably set such that Sa1 is 0.001 µm or more and 0.3 µm or less and the percent change of Sdr is 0.1% or more and 60% or less, and is still more preferably set such that Sa1 is 0.005 µm or more and 0.2 µm or less and the percent change of Sdr is 1% or more and 40% or less. That is, Sa1 is 0.5 µm or less, preferably 0.3 µm or less, more preferably 0.001 µm or more and 0.3 µm or less, and still more preferably 0.005 µm or more and 0.2 µm or less. When Sa1 falls within the above ranges, the waviness component hardly affecting high frequency characteristics can be effectively eliminated. In addition, the percent change of Sdr is 80% or less, preferably 70% or less, more preferably 0.1% or more and 60% or less, and still more preferably 1% or more and 40% or less. When the percent change of Sdr falls within the above ranges, the roughness component (nodule component) largely affecting high frequency characteristics can be left reliably. That is, when processing with the L filter with a cutoff value for eliminating the roughness component is carried out, the percent change of Sdr increases. Therefore, elimination of the roughness component which is required for evaluation of high frequency characteristics can be effectively suppressed by controlling the percent change of Sdr to fall within the above ranges. Accordingly, a surface parameter of the surface-treated copper foil having high correlation with high frequency characteristics can be calculated in a step described later by setting the cutoff value for the L filter so as to satisfy the above conditions.

According to a second aspect of the present invention, the cutoff value for the L filter is set so as to satisfy the following items: (i) Sa1, which is the Sa after processing with the L filter, is 0.5 µm or less; and (ii') the percent change of a value before and after processing with the L filter represented by the formula (|α0−α1|/α0)×100 (in the formula, α0 is the α value before processing with the L filter, and α1 is the α value after processing with the L filter) is 80% or less. The cutoff value for the L filter is more preferably set such that Sa1 is 0.3 µm or less and the percent change of a value is 70% or less, is still more preferably set such that Sa1 is 0.001 µm or more and 0.3 µm or less and the percent change of a value is 0.1% or more and 60% or less, and is especially preferably set such that Sa1 is 0.005 µm or more and 0.2 µm or less and the percent change of a value is 1% or more and 40% or less. That is, Sa1 is preferably 0.5 µm or less, more preferably 0.3 µm or less, still more preferably 0.001 µm or more and 0.3 µm or less, and especially preferably 0.005 µm or more and 0.2 µm or less. When Sa1 falls within the above ranges, the waviness component hardly affecting high frequency characteristics can be effectively eliminated. In addition, the percent change of a value is preferably 80% or less, more preferably 70% or less, still more preferably 0.1% or more and 60% or less, and especially preferably 1% or more and 40% or less. When the percent change of a value falls within the above ranges, the roughness component (nodule component) largely affecting high frequency characteristics can be left reliably. That is, when filter processing is carried out at a cutoff value for eliminating the roughness component, the percent change of a value increases. Therefore, elimination of the roughness component which is required for evaluation of high frequency characteristics can be effectively suppressed by controlling the percent change of a value to fall within the above ranges. Accordingly, a surface parameter of the surface-treated copper foil having high correlation with high frequency characteristics can be calculated in a step described later by setting the cutoff value for the L filter so as to satisfy the above conditions.

The cutoff value for the L filter may be set as follows. Firstly, the surface profile of the reference copper foil 10 is analyzed provisionally using multiple cutoff values for the L filter, and a surface parameter with each cutoff value is calculated. Then, a preferable cutoff value is determined among the multiple cutoff value on the basis of the calculated surface parameters. The cutoff value can be successfully determined in such a manner by obtaining a changing point according to the conditions described in the examples of the present specification, for example. In particular, from the viewpoint of more reliably setting the cutoff value to an optimal value, it is preferable that a second order differential of a surface parameter (for example, a Sdr or an α value) defined in ISO25178 be calculated to set the cutoff value for the L filter.

(3) Acquisition of Surface Profile of Copper Foil as a Measurement Object

As illustrate in (ii) of FIG. 5, a surface profile on a treated surface of surface-treated copper foil 10' as a measurement object is acquired. Here, the surface-treated copper foil as the measurement object herein is sometimes referred to as "copper foil as the measurement object." The copper foil 10' as the measurement object is produced or treated under the same conditions as those for the reference copper foil 10. Examples thereof include a case where the reference copper foil 10 and the copper foil 10' as the measurement object are products having the same specifics and differing in lots. However, the reference copper foil 10 and the copper foil 10' as the measurement object may be the same product when the positions at which the surface profile is acquired on the respective treated surfaces of the reference copper foil 10 and the copper foil 10' as the measurement object are different from each other. That is, the method of the present invention can be preferably used for, for example, checking a change in the state of a surface-treated surface between an initial stage and a later stage in a production lot, in a case where long surface-treated copper foil such as a surface-treated copper foil roll is produced.

In such a manner, the method for measuring a surface parameter of copper foil according to the present invention can be preferably used for product control, quality assurance, and the like. That is, products with good quality can be easily and reliably selected and shipped as described below by using the surface parameter acquired through the steps of the present invention. For example, measurement of the surface profile of the copper foil 10' as the measurement object and calculation of the surface parameter may be carried out immediately after production of the copper foil 10' as the measurement object or may be carried out at the time of pre-shipment inspection.

The surface profile of the copper foil 10' as the measurement object can be acquired using various known devices such as an atomic force microscope (AFM), a contact-type surface roughness measuring device, and a non-contact-type surface roughness measuring device. For example, the surface profile is preferably acquired by measuring a surface of the copper foil 10' as the measurement object using a commercially available laser microscope, which is a non-contact-type surface roughness measuring device. The conditions described above for acquisition of the surface profile of the reference copper foil 10 can be directly adopted as measurement conditions for the laser microscope.

(4) Filter Processing of Surface Profile of Copper Foil as the Measurement Object The acquired surface profile of the surface-treated copper foil 10' as the measurement object is subjected to filter processing. This filter processing involves processing using the L filter with the cutoff value set on the basis of the surface profile of the reference copper foil 10 described above. The waviness component of copper foil hardly affecting high frequency characteristics as described above can be selectively eliminated by doing so, making it possible to calculate a surface parameter reflecting the roughness component largely affecting high frequency characteristics.

The above filter processing is preferably conducted without using an S filter. If processing with an S filter is conduced, irregularities smaller than a cutoff value for the S filter are averaged (removed). Accordingly, small nodules (roughening particles and the like) present on the copper foil 10' as the measurement object can be more reliably detected by carrying out filter processing without using an S filter, and a surface parameter having higher correlation with high frequency characteristics can be calculated as a result.

(5) Calculation of Surface Parameter of Copper Foil as the Measurement Object

At least one of the surface parameters defined in ISO25178 on the treated surface of the surface-treated copper foil 10' as the measurement object is calculated on the basis of the surface profile after filter processing. The surface parameter calculated through the above described steps is a parameter from which effect of the waviness component is eliminated enough and which accurately reflects the roughness component of the surface-treated copper foil, and high frequency characteristics can thus be predicted with high accuracy. As a result, actual evaluation of high frequency characteristics conducted every time copper foil is produced is made unnecessary, making it possible to eliminate waste of working hours and materials.

Preferable examples of the surface parameter to be calculated include an Sa, a Sq, a Sz, a Sdr, a Vmc, a Sk, and a combination thereof (for example an α value), are more preferably an Sa, a Sq, a Sdr, a Vmc, a Sk, and a combination thereof, still more preferably an Sa, a Sdr, a Vmc, a Sk, and a combination thereof, and especially preferably an Sa, a Sdr, and the combination thereof. When the surface parameter is any of these surface parameters, higher correlation with high frequency characteristics is provided.

Method for Selecting Copper Foil

According to a preferable aspect of the present invention, a method for selecting copper foil is provided. This method for selecting copper foil involves a step of measuring a surface parameter of copper foil according to the above-described method, and a step of selecting copper foil having a predetermined surface parameter as copper foil suitable for a printed-wiring board for high frequency application.

The surface parameter of the copper foil measured in the present aspect is at least one selected from the group consisting of an Sa, a Sq, a Sz, a Sdr, a Vmc, and a Sk. Then, copper foil having a surface having an Sa, a Sdr, a Vmc, and/or a Sk satisfying the ranges shown in Table 1 is selected as copper foil suitable for a printed-wiring board for high frequency application.

TABLE 1

| | Sa | Sq | Sz | Sdr | Vmc | Sk |
|---|---|---|---|---|---|---|
| Suitable range | 1.2 μm or less | 2.5 μm or less | 14 μm or less | 60% or less | 1.5 μm³ or less | 4 μm or less |
| Preferable range | 0.05 μm or more 1.0 μm or less | 0.05 μm or more 2.0 μm or less | 0.5 μm or more 5.0 μm or less | 0.5% or more 60% or less | 0.05 μm³ or more 1.4 μm³ or less | 0.15 μm or more 3.0 μm or less |
| More preferable range | 0.05 μm or more 0.5 μm or less | 0.05 μm or more 1.0 μm or less | 0.5 μm or more 3.0 μm or less | 0.5% or more 60% or less | 0.05 μm³ or more 0.7 μm³ or less | 0.15 μm or more 1.6 μm or less |
| Still more preferable range | 0.05 μm or more 0.15 μm or less | 0.05 μm or more 0.5 μm or less | 0.5 μm or more 2.0 μm or less | 0.5% or more 20% or less | 0.05 μm³ or more 0.2 μm³ or less | 0.15 μm or more 0.5 μm or less |

As described above, the surface parameter of copper foil measured by the method of the present invention has high correlation with high frequency characteristics and thus can be used as an alternative index for high frequency characteristics. In this regard, copper foil having a surface with a surface parameter satisfying the above ranges can be determined as copper foil especially excellent in high frequency characteristics and thus can be considered as copper foil suitable for a printed-wiring board for high frequency application.

Method for Producing Printed-Wiring Board

According to a preferable aspect of the present invention, a method for producing a printed-wiring board for high frequency application is provided. This method for producing a printed-wiring board includes a step of producing a printed-wiring board for high frequency application using copper foil obtained by the above described method. A known layer structure can be adopted for the printed-wiring board. That is, production of a printed-wiring board can employ a known method and known conditions and is not particularly limited except for using surface-treated copper foil selected by the methods of the present invention.

The printed-wiring board produced by the method of the present invention is preferably used for high frequency application of 1 GHz or more, more preferably 3 GHz or more, and still more preferably 20 GHz or more and 300 GHz or less.

EXAMPLES

The present invention will be more specifically described with the following examples.

Examples A1 to A3

A cutoff value for an L filter was set on the basis of a surface profile of reference copper foil according to the method of the present invention, and the correlation between the surface parameter of copper foil as the measurement object and high frequency characteristics was checked. Specifically, see the following.

Example A1

(1) Provision of Reference Copper Foil

Firstly, two kinds of copper foil (deposited foil) without change after electrodeposited foil production were provided, as untreated copper foil, as follows.
  Untreated copper foil I: thickness of 18 µm, produced by the method disclosed in Patent Literature 2 (JPH9-241882A)
  Untreated copper foil II: thickness of 18 µm, produced by the method disclosed in Patent Literature 3 (WO2008/041706A1)

Thereafter, as shown in Table 2, five kinds of surface-treated copper foil (copper foil a to copper foil e) differing in surface roughness were produced, as reference copper foil, by subjecting the electrode surface or the deposition surface of untreated copper foil I or II to a surface treatment (roughening treatment) under known conditions. Here, copper foil a, copper foil c, and copper foil e are obtained by subjecting the deposition surface of untreated copper foil II to a roughening treatment, under conditions different from one another, and thus have surface roughness different from one another. In addition, produced copper foil a to copper foil e all have properties (surface roughness, high frequency characteristics, and the like) similar to those of commercially available products.

(2) Acquisition of Surface Profile of Reference Copper Foil

Treated surfaces of the produced surface-treated copper foil were measured using a laser microscope (manufactured by Olympus Corporation, OLS-5000) under conditions of the measurement area of 4096 µm² and the magnification of 200 times to acquire surface profiles.

(3) Setting of Cutoff Value for L Filter

Figure 6A:
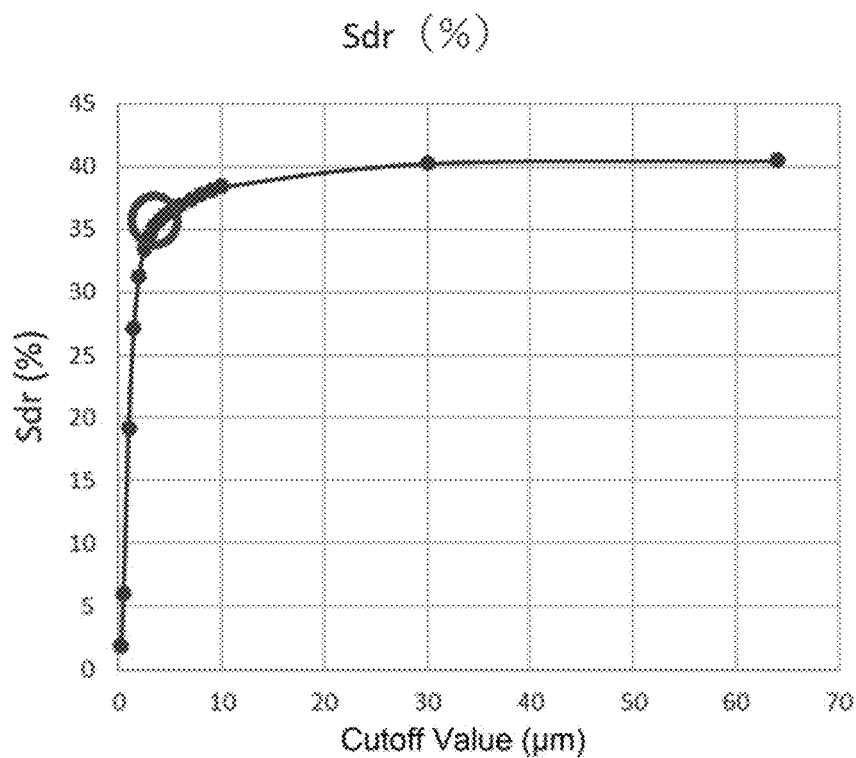
FIG. 6A is a graph exhibiting the Sdr of a treated surface of copper foil b after processing with an L filter with each cutoff value in Example A1.
Figure 6B:
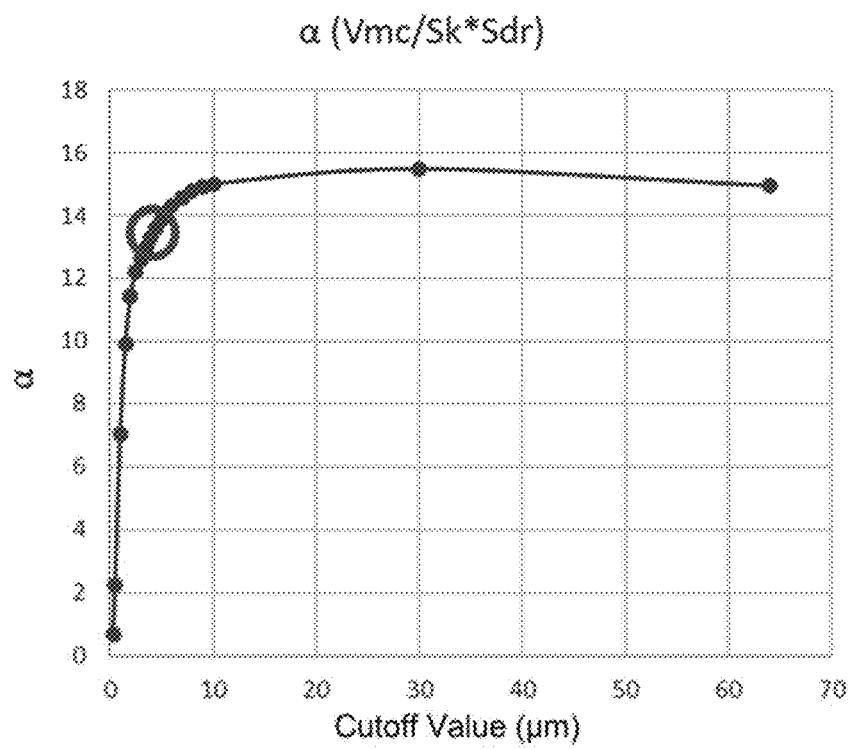
FIG. 6B is a graph showing the α value of a treated surface of copper foil b after processing with an L filter with each cutoff value in Example A1.
Figure 7:
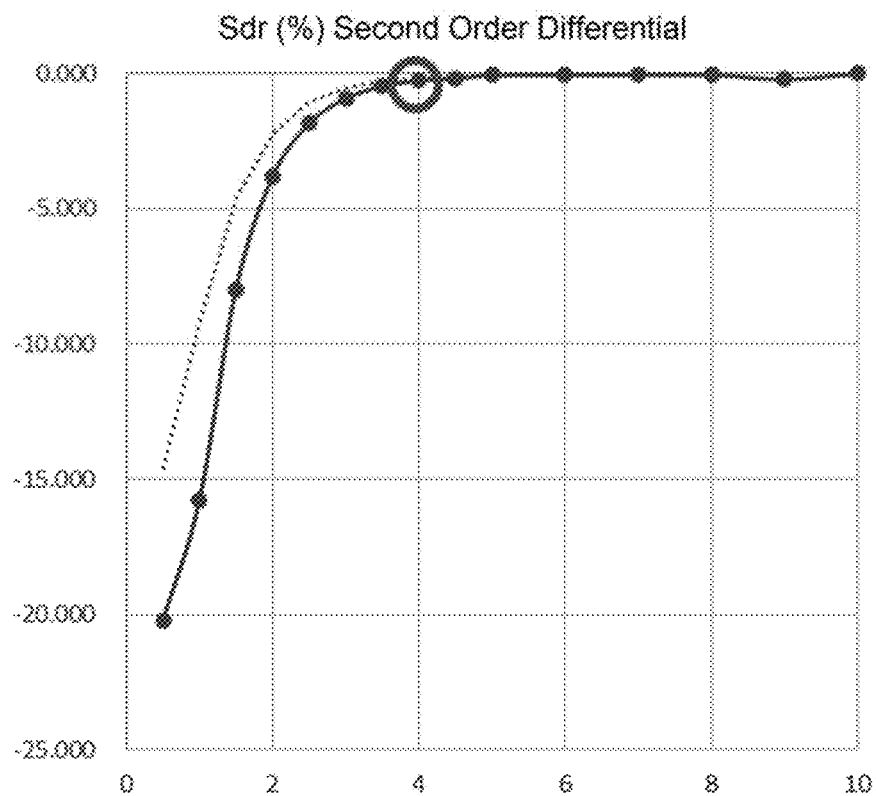
FIG. 7 is a graph showing second order differentials of the Sdr before and after processing with an L filter on a treated surface of copper foil b.
Figure 8A:
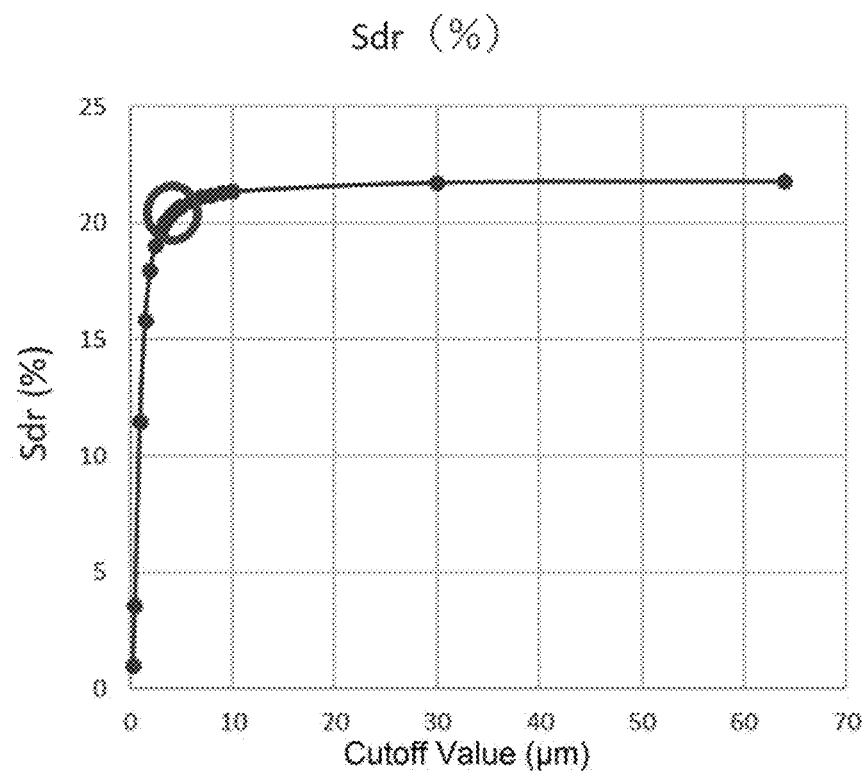
FIG. 8A is a graph showing the Sdr of a treated surface of copper foil d after processing with an L filter with each cutoff value in Example A1.
Figure 8B:
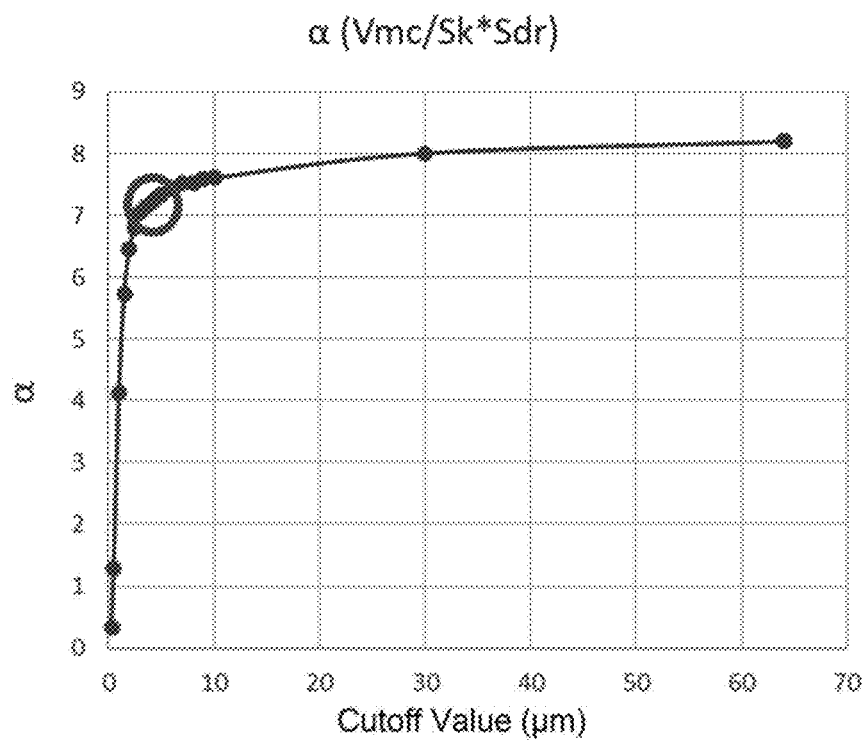
FIG. 8B is a graph showing the α value of a treated surface of copper foil d after processing with an L filter with each cutoff value in Example A1.
Figure 9:
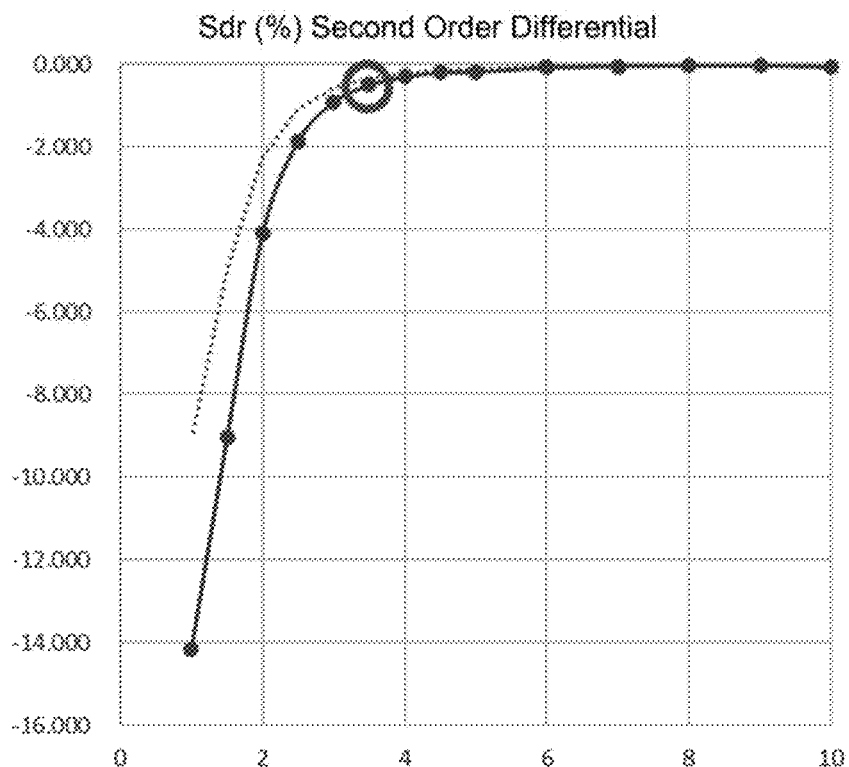
FIG. 9 is a graph showing second order differentials of the Sdr before and after processing with an L filter on a treated surface of copper foil d.
Figure 10A:
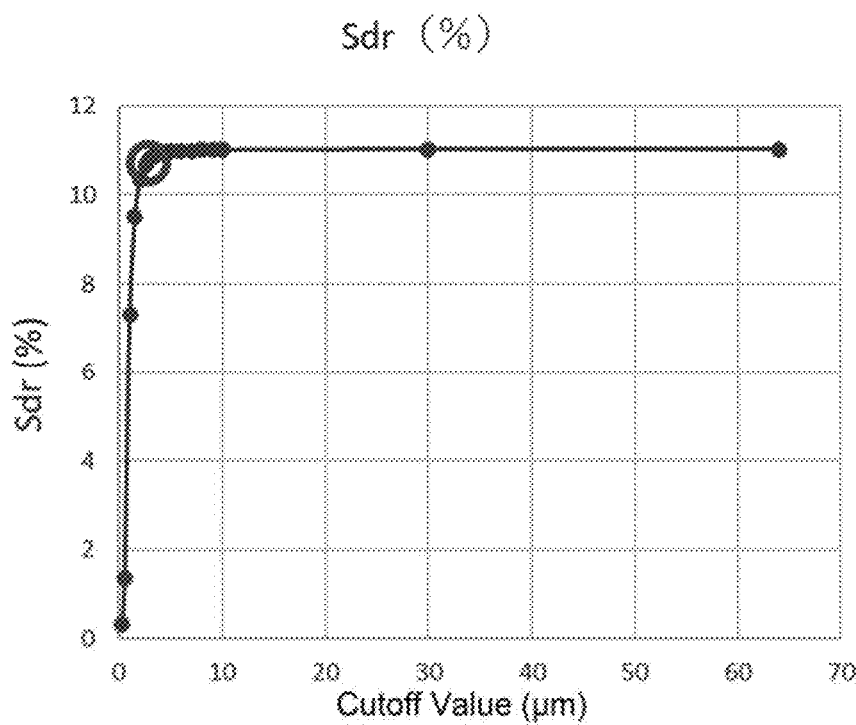
FIG. 10A is a graph showing the Sdr of a treated surface of copper foil e after processing with an L filter with each cutoff value in Example A1.
Figure 10B:
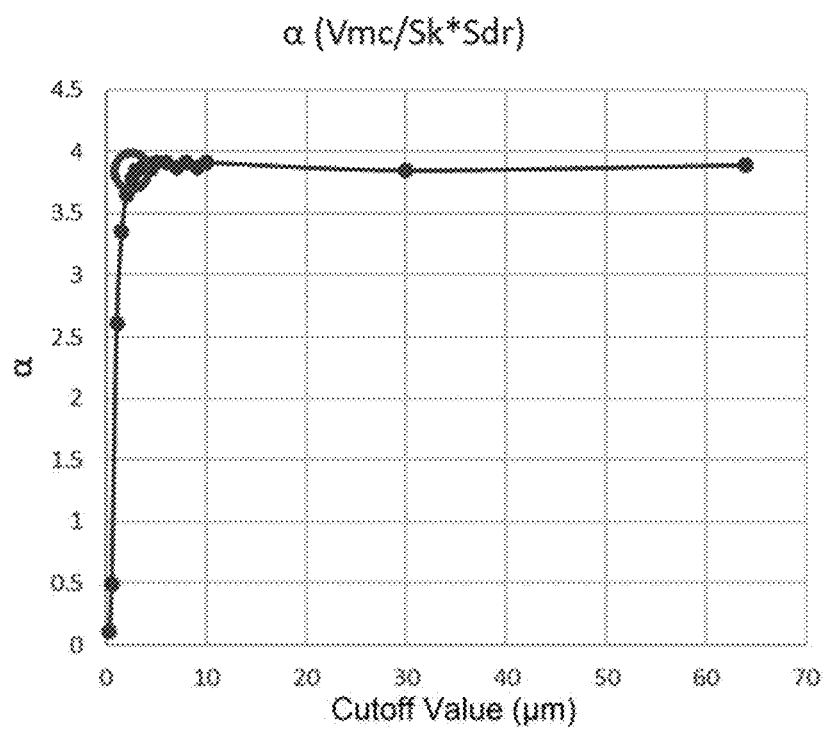
FIG. 10B is a graph showing the α value of a treated surface of copper foil e after processing with an L filter with each cutoff value in Example A1.
Figure 11:
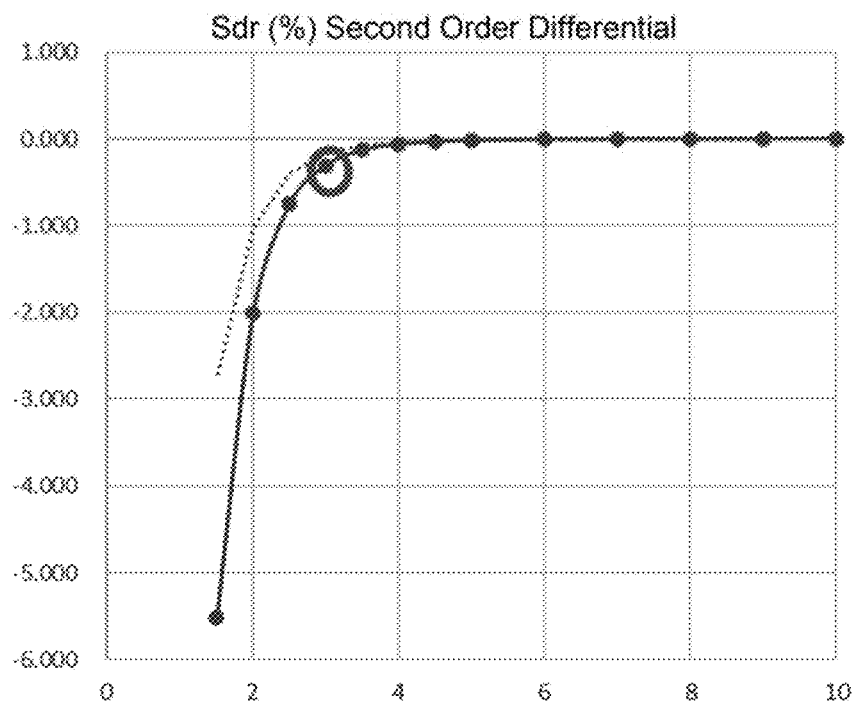
FIG. 11 is a graph showing second order differentials of the Sdr before and after processing with an L filter on a treated surface of copper foil e.

The Sa, the Sdr, the Vmc, and the Sk were calculated by analyzing the obtained surface profiles of the reference copper foil. Specifically, the Sa, the Sdr, the Vmc, and the Sk after L filter processing with each cutoff value were calculated through analysis conducted with the cutoff value for the L filter changed to 0.3 µm, 0.5 µm, 1.0 µm, 1.5 µm, 2.0 µm, 2.5 µm, 3.0 µm, 3.5 µm, 4.0 µm, 4.5 µm, 5.0 µm, 6.0 µm, 7.0 µm, 8.0 µm, 9.0 µm, 10 µm, 30 µm, and 64 µm. In addition, the Sdr, the Vmc, and the Sk were also calculated in the same manner under conditions without cutoff with an L filter. The α value (=(Vmc/Sk)×Sdr) was calculated on the basis of the calculated Sdr, Vmc, and Sk, and the second order differential of the Sdr and the second order differential of the α value were calculated before and after L filter processing. For reference, FIGS. 6A and 6B show the Sdr and the α value after L filter processing with each cutoff value on copper foil b, respectively. FIG. 7 shows the second order differentials of the Sdr before and after L filter processing on copper foil b. In addition, FIGS. 8A and 8B show the Sdr and the α value after L filter processing with each cutoff value on copper foil d, respectively. FIG. 9 shows the second order differentials of the Sdr before and after L filter processing on copper foil d. Furthermore, FIGS. 10A and 10B show the Sdr and the α value after L filter processing with each cutoff value on copper foil e, respectively. FIG. 11 shows the second order differentials of the Sdr before and after L filter processing on copper foil e.

With respect to each of copper foil a to copper foil e, the cutoff value for the L filter at which the Sdr and the α value be a changing point was checked from the Sdr and the α value after L filter processing with each cutoff value and the calculation result of the Sdr second order differential. As a result, each of the Sdr and the α value was confirmed to be the changing point at the cutoff value of 4.0 µm for copper foil a and copper foil b, at the cutoff value of 3.5 µm for copper foil c and copper foil d, and at the cutoff value of 3.0 µm for copper foil e. It was confirmed that the percent change of Sdr and the percent change of α value in copper foil a to copper foil e were all 80% or less, and the Sa (that is, Sa1) values after L filter processing were all 0.5 µm or less, when L filter processing was carried out with these cutoff values. From the above results, the cutoff value for the L filter for each of copper foil a to copper foil e was set as shown in Table 2. Here, the "changing point" herein is the point at which the inclination of the line in the graph showing the relation between cutoff values and a surface parameter (the Sdr and the α value in the present case) significantly changes. Setting the cutoff value to a value smaller than the changing point indicates shifting to a domain in which small irregularities actually present on a surface are averaged (removed). However, since it is difficult to definitely and unambiguously define the "changing point," the "changing point" is a concept allowed to range at a certain level. When the second order differential in the relationship between the cutoff value and a surface parameter is used, accuracy in determination of the "changing point" is enhanced, assisting setting of a more preferable cutoff value. The "changing point" was calculated by using second order differential values of the Sdr and the α value on the treated surface of each of copper foil a to copper foil e in the present examples. A three moving average was used in calculating a second order differential for error reduction.

(4) Provision of Copper Foil as the Measurement Object

Five kinds of surface-treated copper foil (copper foil a' to copper foil e') were produced as copper foil as the measurement object with the same conditions as those for the reference copper foil (copper foil a to copper foil e) produced in (1) above, respectively.

(5) Acquisition of Surface Profile of Copper Foil as the Measurement Object

Treated surfaces of copper foil as the measurement object were measured using a laser microscope (manufactured by Olympus Corporation, OLS-5000) under conditions of the measurement area of 4096 μm² and the magnification of 200 times to acquire surface profiles.

(6) Filter Processing and Surface Parameter Calculation

The surface profile of each kind of the copper foil as the measurement object was subjected to filter processing. At this time, the cutoff value for the L filter was set to numerical values set in item (3) above, that is, to 4.0 μm for copper foil a and copper foil b, to 3.5 μm for copper foil c and copper foil d, and to 3.0 μm for copper foil e as shown in Table 2. Processing with an S filter was not conducted, and only processing with the L filter was conducted in this filter processing. The Sa, the Sdr, the Vmc, and the Sk were calculated on the basis of the surface profiles after filter processing, and the α value was also calculated. Results are shown in Table 2.

(7) Evaluation of High Frequency Characteristics

A substrate (manufactured by Panasonic Corporation, MEGTRON6N) for high frequencies was provided as an insulating resin substrate. Each surface-treated copper foil (copper foil a' to copper foil e') was stacked on both sides of the insulating resin substrate such that the treated surface of the surface-treated copper foil abutted on the insulating resin substrate, followed by lamination using a vacuum pressing machine under conditions of a temperature of 190° C. and a pressing time of 120 minutes to obtain a copper-clad laminated sheet with an insulation thickness of 136 μm. Thereafter, the copper-clad laminated sheet was subjected to etching processing to obtain a substrate for transmission loss measurement in which a microstrip line was formed such that characteristic impedance became 50Ω. Transmission loss (dB/cm) at 50 GHz was measured for the obtained substrate for transmission loss measurement using a network analyzer (manufactured by Keysight Technologies, N5225B). Results are shown in Table 2.

(8) Correlation Between Surface Parameter and High Frequency Characteristics

Evaluation results of the respective kinds of copper foil were plotted, with the transmission loss as the horizontal axis and the surface parameter (the Sr or the α value) as the vertical axis. A regression formula was obtained by linear approximation (least-square method) on the basis of these plot data, and a determination coefficient $R^2$ was calculated. As a result, the determination coefficient $R^2$ in the regression formula in the case where the Sdr was adopted in the vertical axis was 0.9786, and the determination coefficient $R^2$ in the regression formula in the case where the α value was adopted in the vertical axis was 0.9717.

TABLE 2

| | Surface treatment | | L filter Cutoff value (μm) | Surface parameter | | | | | High frequency characteristics |
|---|---|---|---|---|---|---|---|---|---|
| | Type of untreated copper foil | Treated surface | | Sa (μm) | Sdr (%) | Vmc (μm³) | Sk (μm) | α value | Transmission loss (dB/cm) |
| Copper foil a' | II | Deposition surface | 4.0 | 0.225 | 67.533 | 0.240 | 0.707 | 22.925 | −0.61 |
| Copper foil b' | I | Deposition surface | 4.0 | 0.152 | 32.126 | 0.163 | 0.436 | 12.010 | −0.54 |
| Copper foil c' | II | Deposition surface | 3.5 | 0.121 | 35.902 | 0.130 | 0.364 | 12.822 | −0.54 |
| Copper foil d' | I | Electrode surface | 3.5 | 0.091 | 20.208 | 0.099 | 0.281 | 7.120 | −0.52 |
| Copper foil e' | II | Deposition surface | 3.0 | 0.047 | 11.231 | 0.054 | 0.131 | 4.630 | −0.51 |

Example A2

Correlation between the surface parameters and high frequency characteristics was checked in the same manner as Example A1 except that the cutoff value for the L filter on the reference copper foil (copper foil a to copper foil e) was set to 5.0 μm, that is, the surface profile of copper foil (copper foil a' to copper foil e') as the measurement object was subjected to filter processing with the cutoff value for the L filter set to 5.0 μm. Here, the percent change of Sdr and the percent change of α value on copper foil a to copper foil e were all 80% or less, and the Sa (that is, Sa1) values after L filter processing were all 0.5 μm or less, when the cutoff value for the L filter was set to 5.0 μm.

As a result, the determination coefficient $R^2$ in the regression formula in the case where the Sdr was adopted in the vertical axis was 0.9666, and the determination coefficient $R^2$ in the regression formula in the case where the α value was adopted in the vertical axis was 0.9518. Here, although the changing points of the Sdr and the α value were assumed to be 4.0 μm (copper foil a and copper foil b), 3.5 μm (copper foil c and copper foil d), or 3.0 μm (copper foil e) in Example A1, these values differ from the set cutoff value (5.0 μm) in Example A2. In this regard, the above-mentioned set cutoff value is permissible as a changing point because changes in the Sdr and in the α value are small within the range within which the cutoff value is 3.0 μm or more and 5.0 μm or less as shown in FIGS. 6A, 6B, 8A, 8B, 10A, and 10B.

Example A3

Correlation between the surface parameters and high frequency characteristics was checked in the same manner as Example A1 except that the cutoff value for the L filter on the reference copper foil (copper foil a to copper foil e) was set to 2.0 μm, that is, the surface profile of copper foil (copper foil a' to copper foil e') as the measurement object was subjected to filter processing with the cutoff value for the L filter set to 2.0 μm. Here, the percent change of Sdr and the percent change of α value on copper foil a to copper foil e were all 80% or less, and the Sa (that is, Sa1) values after L filter processing were all 0.5 μm or less, when the cutoff value for the L filter was set to 2.0 μm.

As a result, the determination coefficient $R^2$ in the regression formula in the case where the Sdr was adopted in the vertical axis was 0.9687, and the determination coefficient $R^2$ in the regression formula in the case where the α value was adopted in the vertical axis was 0.9609. Here, although the changing points of the Sdr and the α value were assumed to be 4.0 μm (copper foil a and copper foil b), 3.5 μm (copper foil c and copper foil d), or 3.0 μm (copper foil e) in Example A1, these values differ from the set cutoff value (2.0 μm) in Example A3. In this regard, the above-mentioned set cutoff value is permissible as a changing point because changes in the Sdr and in the α value are small within the range within which the cutoff value is 2.0 μm or more and 4.0 μm or less as shown in FIGS. 6A, 6B, 8A, 8B, 10A, and 10B.

Figure 12:
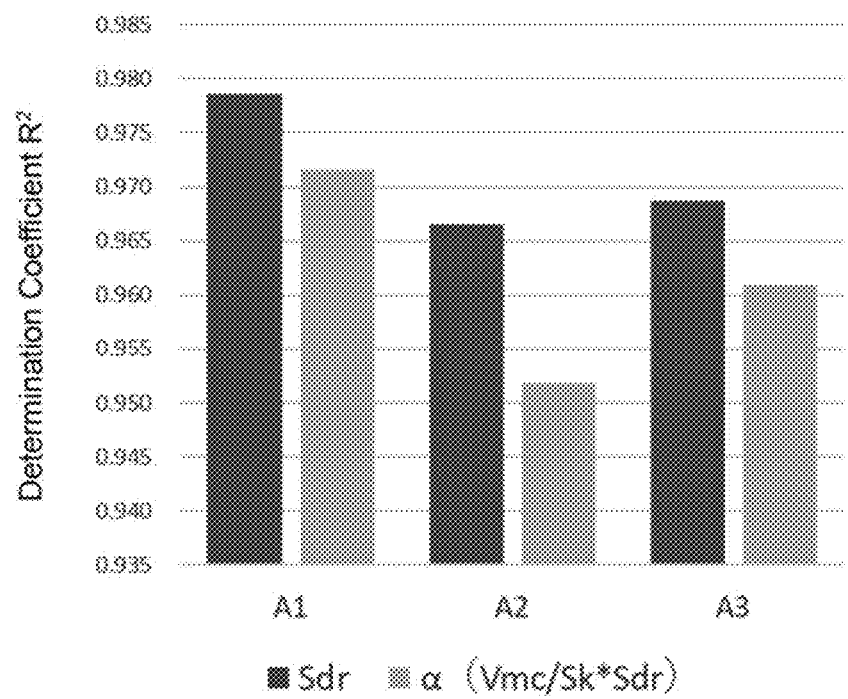
FIG. 12 is a graph comparing determination coefficients $R^2$ of regression formulae of surface parameters of copper foil and transmission loss in Examples A1 to A3.

FIG. 12 is a graph comparing the determination coefficients $R^2$ of regression formulae of the surface parameter (the Sdr or the α value) of copper foil and transmission loss in Examples A1 to A3. As shown in FIG. 12, the correlation between the surface parameters and high frequency characteristics was good in all of Examples A1 to A3. That is, it was confirmed that when the cutoff value for the L filter was preliminarily set using the reference copper foil (copper foil a to copper foil e) on the basis of a predetermined condition, surface parameters of the copper foil (copper foil a' to copper foil e') as the measurement object accurately reflected high frequency characteristics. In addition, the results demonstrated that the surface parameters (surface parameters calculated in Example A1) calculated with the cutoff value individually set according to each surface parameter of the reference copper foil provided better correlation with high frequency characteristics compared with the surface parameters (surface parameters calculated in Examples A2 and A3) calculated with a fixed cutoff value for the L filter.

Consequently, while production of a sample substrate for evaluation of high frequency characteristics using surface-treated copper foil and evaluation thereof have conventionally been required each time, these processes are made unnecessary, leading to elimination of waste of working hours and materials Examples B1 to B8

It was confirmed that the surface parameters of surface-treated copper foil showed high correlation with high frequency characteristics when a predetermined condition was satisfied, by changing the cutoff value for the L filter. Specifically, see the following.

Example B1 (Comparison)

(1) Provision of Reference Copper Foil

Five kinds of surface-treated copper foil (copper foil a to copper foil e) differing in surface roughness were provided as reference copper foil in the same manner as Example A1.

(2) Acquisition of Surface Profile of Reference Copper Foil

The surface profile on the treated surface of each kind of the reference copper foil was acquired in the same manner as in Example A1.

(3) Setting of Cutoff Value for L Filter

The Sa, the Sdr, the Vmc, and the Sk were calculated by analyzing each surface profile of the obtained reference copper foil with the cutoff value for the L filter set to 64 μm. As a result, it was confirmed that the Sa (that is, Sa1) after L filter processing of copper foil b was a value exceeding 0.5 μm. In addition, the Sdr, the Vmc, and the Sk without cutoff with an L filter were calculated. The α value (=(Vmc/Sk)× Sdr) was calculated on the basis of the calculated Sdr, Vmc, and Sk, and the percent change of Sdr and the percent change of a value before and after L filter processing were calculated. As a result, the percent change of Sdr and the percent change of a value were all 80% or less in copper foil a to copper foil e.

(4) Provision of Copper Foil as the Measurement Object

Five kinds of surface-treated copper foil (copper foil a' to copper foil e') differing in surface roughness were provided as copper foil as the measurement object in the same manner as Example A1.

(5) Acquisition of Surface Profile of Copper Foil as the Measurement Object

Treated surfaces of copper foil as the measurement object were measured with a laser microscope in the same manner as Example A1 to obtain surface profiles.

(6) Filter Processing and Surface Parameter Calculation

The surface profile of each kind of copper foil was subjected to filter processing. At this time, the cutoff value for the L filter was set to 64 μm. Processing with an S filter was not conducted, and only processing with the L filter was conducted in this filter processing. The Sa, the Sq, the Sz, the Sdr, the Vmc, and the Sk were calculated on the basis of the surface profile after filter processing, and the α value was also calculated.

(7) Evaluation of High Frequency Characteristics

A substrate for transmission loss measurement was produced using each of copper foil a' to copper foil e', and transmission loss at 50 GHz was measured in the same manner as Example A1.

(8) Correlation Between Surface Parameter and High Frequency Characteristics

Figure 13:
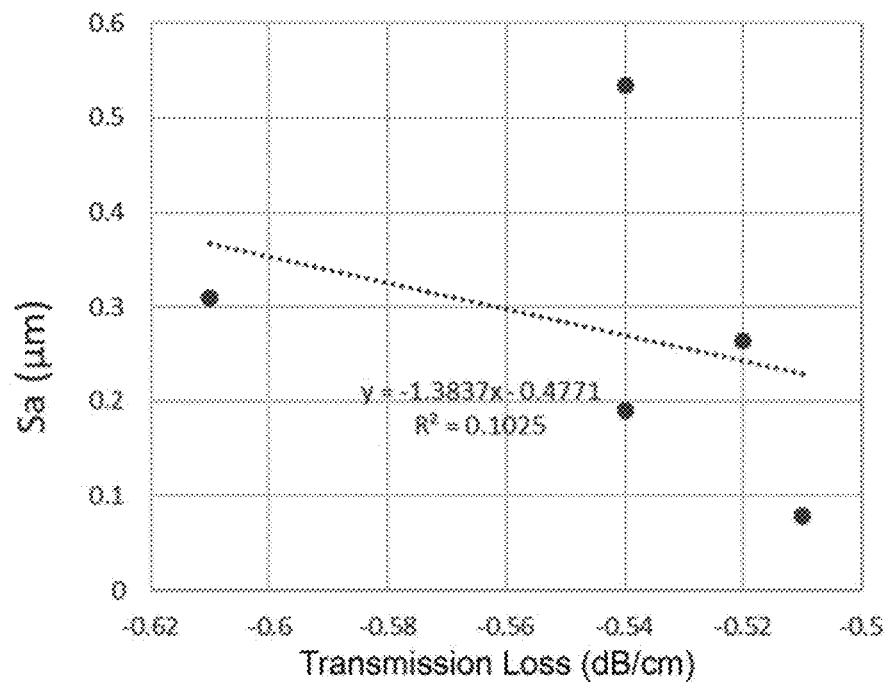
FIG. 13 is a graph showing the correlation between the arithmetical mean heights Sa of copper foil a to copper foil e and high frequency characteristics in Example B1.

Evaluation results of the respective kinds of copper foil were plotted, with the transmission loss as the horizontal axis and the surface parameter (the Sa, the Sq, the Sz, the Sdr, the Vmc, the Sk, or the α value) as the vertical axis. A regression formula was obtained by linear approximation (least-square method) on the basis of these plot data, and a determination coefficient $R^2$ was calculated. Results are shown in Table 3. For reference, FIG. 13 shows a graph representing the correlation between the Sa of copper foil a to copper foil e and high frequency characteristics.

Examples B2 to B7

Correlation between the surface parameters and high frequency characteristics was checked in the same manner as Example B1 except that the cutoff value was changed to 1.0 to 10 μm as shown in Table 3 in setting the cutoff value for the L filter using reference copper foil and in L filter processing of the surface profiles of copper foil as the measurement object. Results are shown in Table 3.

Figure 14:
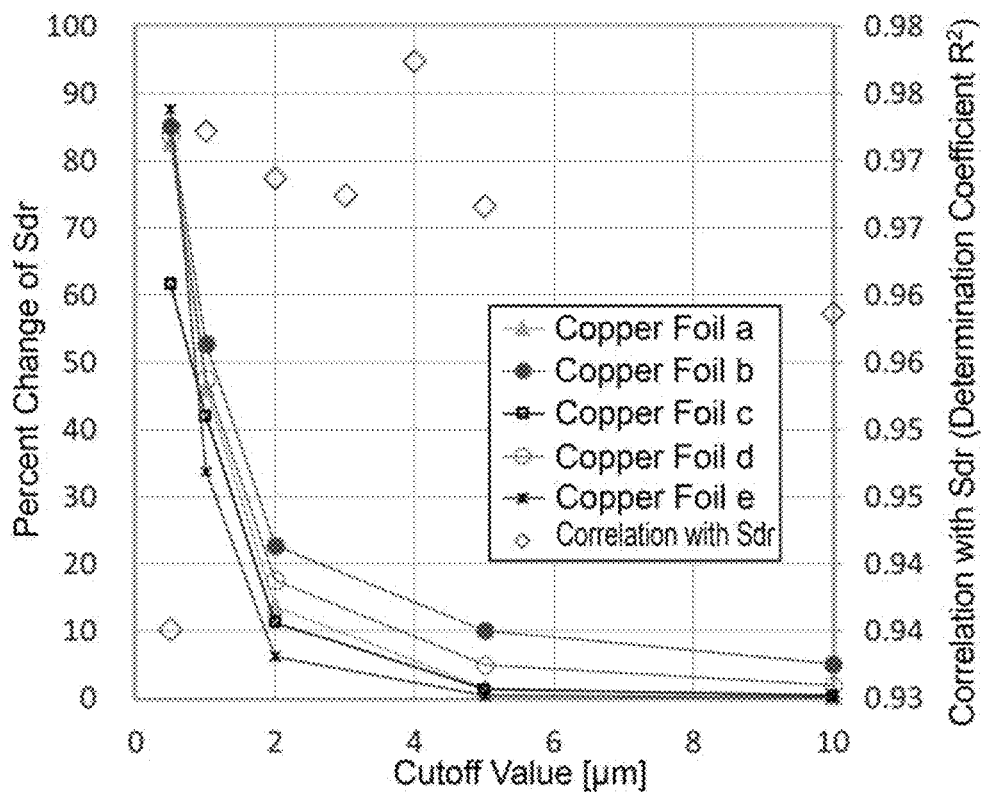
FIG. 14 is a graph exhibiting the correlation (determination coefficients $R^2$) between percent change of Sdr of copper foil a to copper foil e and high frequency characteristics in Examples B2 to B8.
Figure 15:
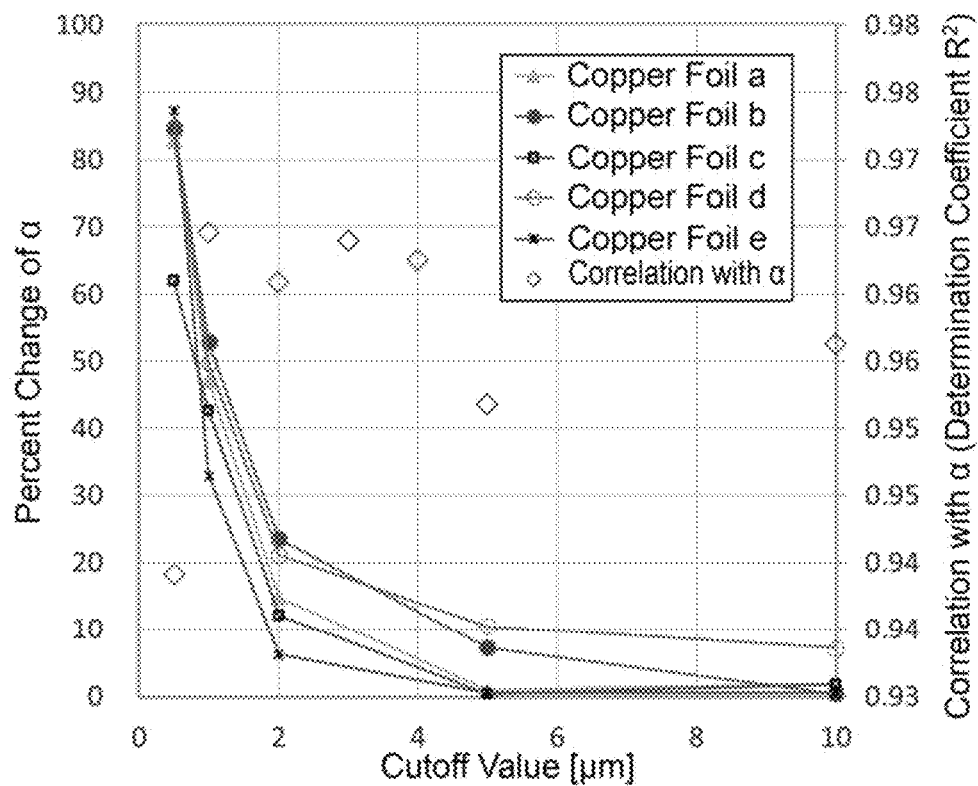
FIG. 15 is a graph exhibiting the correlation (determination coefficients $R^2$) between percent change of a value of copper foil a to copper foil e and high frequency characteristics in Examples B2 to B8.
Figure 16:
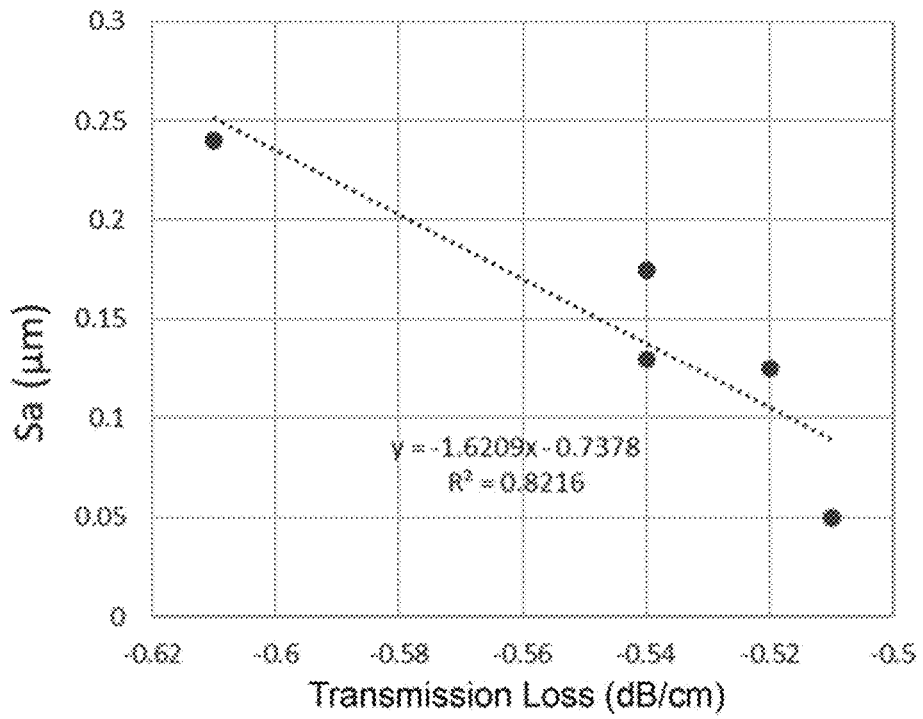
FIG. 16 is a graph showing the correlation between the arithmetical mean heights Sa of copper foil a to copper foil e and high frequency characteristics in Example B3.

FIG. 14 shows a graph representing the correlation (determination coefficients $R^2$) between the percent change of Sdr of copper foil a to copper foil e and high frequency characteristics, and FIG. 15 shows a graph representing the correlation (determination coefficients $R^2$) between the percent change of a value of copper foil a to copper foil e and high frequency characteristics. As shown in FIG. 14 and FIG. 15, the percent change of Sdr and the percent change of a value on the treated surfaces of copper foil a to copper foil e were all 80% or less when the cutoff value for the L filter was set to 1.0 to 10 μm. In addition, the Sa values on the treated surfaces of copper foil a to copper foil e were all 0.5 μm or less when the cutoff value for the L filter was set to 1.0 to 10 μm. For reference, a graph representing the correlation between high frequency characteristics and the Sa (that is, Sa1) on copper foil a to copper foil e after L filter processing in Example B3 (cutoff value for L filter: 5 μm) is shown in FIG. 16.

Example B8 (Comparison)

Correlation between the surface parameters and high frequency characteristics was checked in the same manner as Example B1 except that the cutoff value was changed to 0.5 μm in setting the cutoff value for the L filter using reference copper foil and in L filter processing of the surface profiles of copper foil as the measurement object. Results are shown in Table 3.

FIG. 14 shows a graph representing the correlation (determination coefficients $R^2$) between the percent change of Sdr in Example B8 and high frequency characteristics, and FIG. 15 shows a graph representing the correlation (determination coefficients $R^2$) between the percent change of a value in Example B8 and high frequency characteristics. As shown in FIG. 14 and FIG. 15, the percent change of Sdr and the percent change of a value on the treated surfaces of copper foil a, copper foil b, copper foil d, and copper foil e all exceeded 80% when the cutoff value for the L filter was set to 0.5 μm. In addition, the Sa values of the treated surface of copper foil a to copper foil e were all 0.5 μm or less when the cutoff value for the L filter was set to 0.5 μm.

being obtained by dividing a core material volume Vmc by a core height Sk to obtain a quotient and multiplying the quotient by a developed interfacial area ratio Sdr, that is, obtained by a formula (Vmc/Sk)× Sdr; and the Sa, the Sdr, the Vmc and the Sk being surface parameters defined by ISO25178;

(c) utilizing the microscope to measure a surface profile on a treated surface of a surface-treated copper foil as a measurement object, the surface-treated copper foil as the measurement object being produced or treated under the same condition as the surface-treated copper foil as the reference;

(d) subjecting the acquired surface profile of the surface-treated copper foil as the measurement object to filter processing, the filter processing including processing using an L filter with the cutoff value; and (e) calculating at least one of surface parameters defined in ISO25178 on the treated surface of the surface-treated copper foil as the measurement object based on the surface profile after the filter processing.

2. The method for measuring a surface parameter of copper foil according to claim 1, wherein, in (d), the filter processing is conducted without using an S filter.

3. The method for measuring a surface parameter of copper foil according to claim 1, wherein the Sa1 is 0.3 μm or less, and the percent change of Sdr is 70% or less.

TABLE 3

|  | L filter Cutoff value (μm) | Correlation between surface parameter and high frequency characteristics (determination coefficient $R^2$) | | | | | | |
| --- | --- | --- | --- | --- | --- | --- | --- | --- |
|  |  | Sa | Sq | Sz | Sdr | Vmc | Sk | α value |
| Example B1* | 64 | 0.1025 | 0.0909 | 0.1005 | 0.9469 | 0.1260 | 0.1089 | 0.9336 |
| Example B2 | 10 | 0.5019 | 0.4500 | 0.2044 | 0.9587 | 0.6481 | 0.5615 | 0.8799 |
| Example B3 | 5.0 | 0.8216 | 0.8142 | 0.2965 | 0.9666 | 0.9104 | 0.8804 | 0.9518 |
| Example B4 | 4.0 | 0.9036 | 0.8733 | 0.3305 | 0.9774 | 0.9442 | 0.9061 | 0.9625 |
| Example B5 | 3.0 | 0.9276 | 0.9050 | 0.3291 | 0.9674 | 0.9476 | 0.9473 | 0.9640 |
| Example B6 | 2.0 | 0.9404 | 0.9220 | 0.2819 | 0.9687 | 0.9659 | 0.9544 | 0.9609 |
| Example B7 | 1.0 | 0.9429 | 0.9345 | 0.3362 | 0.9722 | 0.9505 | 0.9424 | 0.9646 |
| Example B8* | 0.5 | 0.3490 | 0.3873 | 0.2679 | 0.9351 | 0.9123 | 0.9084 | 0.9391 |

The symbol * represents comparative examples.

The invention claimed is:

1. A method for measuring a surface parameter of copper foil, the method comprising:
    (a) utilizing a microscope to measure a surface profile on a treated surface of a surface-treated copper foil as a reference for setting a filter condition;
    (b) setting a cutoff value for an L filter based on the surface profile, wherein the cutoff value satisfies:
        (i) Sa1, which is an arithmetical mean height Sa after processing with the L filter, being 0.5 μm or less, and
        (ii) a percent change of developed interfacial area ratio Sdr before and after processing with the L filter being 80% or less, the percent change of Sdr being represented by a formula (|Sdr0−Sdr1|/Sdr0)×100, wherein Sdr0 is an Sdr before processing with the L filter, and Sdr1 is an Sdr after processing with the L filter, or
        (ii') a percent change of a value before and after processing with the L filter being set to be 80% or less, the percent change of a value being represented by a formula (|α0−α1|/α0)×100, wherein α0 is an α value before processing with the L filter, and α1 is an α value after processing with the L filter; the α value 4. The method for measuring a surface parameter of copper foil according to claim 1, wherein the Sa1 is 0.3 μm or less, and the percent change of a value is 70% or less.

5. The method for measuring a surface parameter of copper foil according to claim 1, wherein, in (b), a second order differential of a surface parameter defined in ISO25178 is calculated to set the cutoff value for the L filter.

6. A method for selecting copper foil, comprising:
    measuring a surface parameter of copper foil using the method according to claim 1, wherein the surface parameter is at least one selected from the group consisting of an arithmetical mean height Sa, a root mean square height Sq, a maximum height Sz, a developed interfacial area ratio Sdr, a core material volume Vmc, and a core height Sk defined by ISO25178; and
    selecting, as a copper foil suitable for a printed-wiring board for high frequency application, a copper foil having a surface in which the Sa is 1.2 μm or less, the Sq is 2.5 μm or less, the Sz is 14 μm or less, the Sdr is 60% or less, the Vmc is 1.5 μm$^3$ or less, and/or the Sk is 4 μm or less.

7. A method for producing a printed-wiring board for high frequency application, comprising the step of producing a printed-wiring board for high frequency application using a copper foil obtained by the method according to claim 6.

8. The method of claim 1, wherein the microscope comprises at least one from among: an atomic force microscope, a contact-type surface roughness measuring device, and a non-contact-type surface roughness measuring device.

9. The method of claim 1, wherein the microscope comprises a laser microscope.

10. The method of claim 1, wherein the microscope comprises at least one from among a confocal chromatic probe, a phase-shifting interferometric microscope, a coherence scanning interferometer, a point autofocus probe, a focus variation microscope, and a confocal microscope.

11. The method of claim 1, wherein the microscope comprises a coherence scanning interferometer.

\* \* \* \* \*